United States Patent [19]

Echizen et al.

[11] Patent Number: 5,069,928
[45] Date of Patent: Dec. 3, 1991

[54] MICROWAVE CHEMICAL VAPOR DEPOSITION APPARATUS AND FEEDBACK CONTROL METHOD

[75] Inventors: Hiroshi Echizen, Tokyo; Satoshi Takaki, Yokohama, both of Japan

[73] Assignee: Canon Kabushiki Kaisha, Tokyo, Japan

[21] Appl. No.: 302,244

[22] Filed: Jan. 27, 1989

[30] Foreign Application Priority Data

Feb. 1, 1988 [JP] Japan .................................. 63-21797

[51] Int. Cl.$^5$ ............................................ C23C 16/50
[52] U.S. Cl. ................................... 427/45.1; 118/723; 219/10.55 A; 219/10.55 R; 315/39; 315/111.21; 427/38
[58] Field of Search ................... 118/719, 723; 427/39, 427/45.1, 38; 315/111.11, 111.21, 111.71, 39; 219/10.55 A, 10.55 F, 10.55 R

[56] References Cited

U.S. PATENT DOCUMENTS

| 4,207,452 | 6/1980 | Arai ........................................ 315/39 |
| 4,507,588 | 3/1985 | Asmussen et al. ............. 219/121.47 |
| 4,831,963 | 5/1989 | Saito et al. ........................... 118/723 |

FOREIGN PATENT DOCUMENTS

| 57-133636 | 8/1982 | Japan . |
| 58-49295 | 3/1983 | Japan . |
| 59-43991 | 3/1984 | Japan . |
| 62-36240 | 9/1987 | Japan . |
| 63-100186 | 5/1988 | Japan .................................. 118/723 |
| 88/10506 | 12/1988 | World Int. Prop. O. ...... 315/111.21 |

Primary Examiner—Shrive Beck
Assistant Examiner—Terry J. Owens
Attorney, Agent, or Firm—Fitzpatrick, Cella, Harper & Scinto

[57] ABSTRACT

A microwave plasma CVD apparatus includes a hermetically sealed vacuum vessel, a device for evacuating the vacuum vessel, and a device for introducing microwaves through a microwave transmission circuit into the vacuum vessel to produce a plasma within the vacuum vessel. The microwave transmission circuit includes a cavity resonator integrally provided with two matching circuits, one of which is a plunger for varying the length of the cavity resonator and the other of which is a pair of sliding matching irises. Feedback in the apparatus can be controlled by driving one of the matching circuits for rough matching of the microwave impedance and driving the other matching circuit for fine matching of the microwave impedance, so that the calculated ratio of the reflected power to the input power, based on a signal from a power monitor, is reduced to a minimum.

6 Claims, 4 Drawing Sheets

PRIOR ART

FIG. 6

PRIOR ART

MICROWAVE CHEMICAL VAPOR DEPOSITION APPARATUS AND FEEDBACK CONTROL METHOD

FIELD OF THE INVENTION

The present invention relates to an improved microwave plasma CVD (chemical vapor deposition) apparatus. More particularly, it relates to an improved microwave plasma CVD apparatus suitable for forming a deposited film on a substrate.

BACKGROUND OF THE INVENTION

The plasma CVD process means a process that produces a plasma of a specific material containing highly active radicals and causes the radicals to deposit a film on the surface of a substrate. Plasma CVD apparatus means an apparatus that is employed in carrying out the plasma CVD process.

The conventional plasma CVD apparatus comprises a plasma CVD chamber comprising a vacuum vessel provided with a material gas inlet opening and a discharge opening and an electromagnetic wave generating device for supplying energy for producing a plasma of a material gas introduced into the plasma CVD chamber.

Incidentally, the plasma CVD process is based on the high activity of the radicals, and the conditions for the plasma CVD process, such as the density of radicals and the temperature of a work, are properly selected so that a desired deposited film may be formed. In this respect, the efficient production of radicals is essential in the plasma CVD process.

In the past, a high-frequency electromagnetic wave of 13.56 MHz had been used for the plasma CVD process. Recently, it has been found that the application of a microwave of a frequency with the order of 2.45 GHz in the plasma CVD process enables efficient production of a high-density plasma and simultaneously, heating the work. Thus, a plasma CVD process using a microwave has become the object of attention and several microwave plasma CVD apparatus have been proposed. For instance, there have been proposed various plasma CVD processes using a microwave (hereinafter referred to as "MW-PCVD process") and apparatus for carrying out the same for forming a deposited film of amorphous silicon (hereinafter referred to as "A-Si"), polycrystal silicon (hereinafter referred to as "p-Si"), $SiO_2$ or SiN for use in preparing, for example, semiconductor devices, photoconductive members for electrophotography, image input sensors, image pickup devices, photovoltaic devices, other electronic devices and optical devices.

These proposed conventional MW-PCVD apparatus are classified roughly into two types.

MW-PCVD apparatus of one of the two types are disclosed in Japanese Patent Publication Nos. 58-49295 and 59-43991 and Japanese Utility Model Publication No. 62-36240. In a MW-PCVD apparatus of this type (hereinafter referred to as "type 1 MW-PCVD apparatus"), a gas pipe is inserted through or placed in contact with a rectangular or coaxial waveguide to produce a plasma.

A MW-PCVD apparatus of the other type is disclosed in Japanese Patent Laid-open (Kokai) No. 57-133636. In this MW-PCVD apparatus (hereinafter referred to as "type 2 MW-PCVD apparatus"), electron cyclotron resonance (ECR) is established within a cavity resonator and a plasma is drawn out by a divergent magnetic field.

Figure 5:
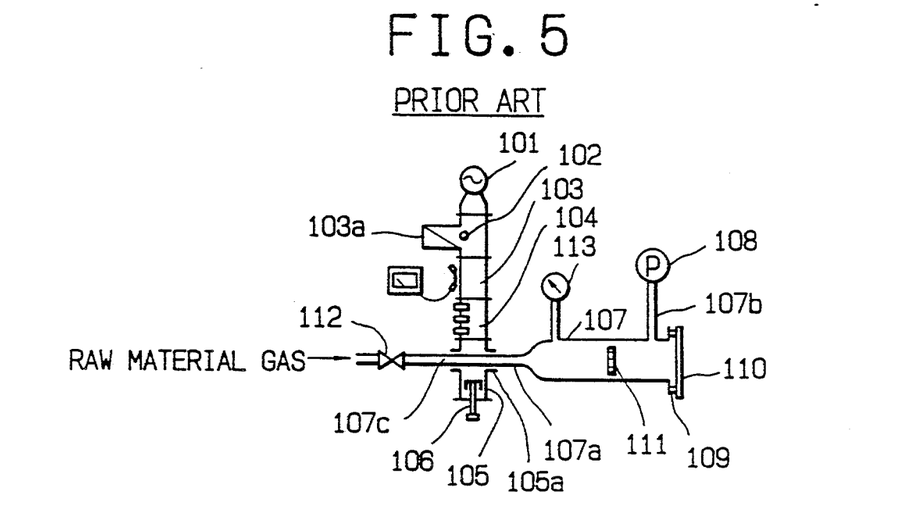
FIGS. 5 and 6 are schematic sectional views of assistance in explaining a conventional MW-PCVD apparatus.

FIG. 5 shows a typical type 1 MW-PCVD apparatus disclosed in Japanese Utility Model Publication No. 62-36240. This type 1 MW-PCVD apparatus comprises a vacuum system, an exhaust system and a microwave generating system.

Referring to FIG. 5, the vacuum system comprises a reactor 107, and a microwave transmissive tube, such as a quartz tube, or a window having an inside diameter on the order of 40 mm and connected to the reactor 107 by a gas introducing pipe 107a. The quartz tube (or the window) is connected to a first gas introducing pipe and is arranged perpendicularly to a microwave waveguide. A second gas introducing pipe is connected to the reactor 107. A gas, such as silane gas, supplied into the reactor 107 is exhausted through the exhaust system (107b and 108). A gas, such as oxygen gas or nitrogen gas, introduced through the first gas introducing pipe into the reactor 107 is converted into a plasma by microwave discharge. During the microwave discharge caused by microwave energy, microwave impedance can be matched with a sliding short-circuit plate, i.e., a plunger 105. Radicals of the plasma thus produced react with the silane gas supplied through the second gas introducing pipe, whereby a silicon dioxide film or a silicon nitride film is formed over the surface of a substrate 111.

Figure 6:
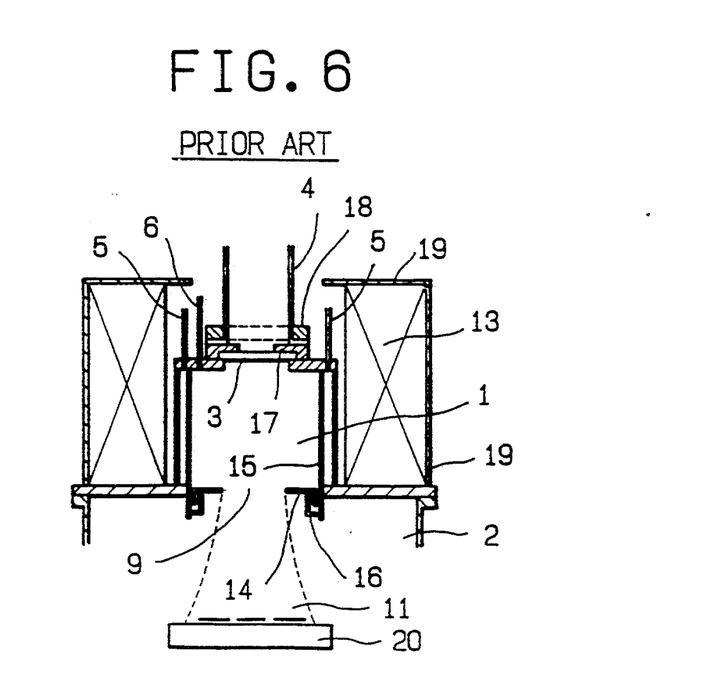

FIG. 6 shows a typical type 2 MW-PCVD apparatus disclosed in Japanese Patent Laid-open (Kokai) No. 57-133636. The systems and configuration of the type 2 MW-PCVD apparatus are the same as those of the foregoing type 1 MW-PCVD apparatus except that the type 2 MW-PCVD apparatus employs an electromagnet 13. In the type 2 MW-PCVD apparatus, the vacuum system comprises a cylindrical plasma producing vessel 1 and a deposition vessel 2 connected to the plasma producing vessel 1. A microwave introducing window 3 is attached hermetically to the plasma producing vessel 1. A first gas introducing pipe 6 and a microwave waveguide 4 are connected to the plasma producing vessel 1. The plasma producing vessel 1 is water-cooled by means of a water-cooling pipe 5. The apparatus shown in FIG. 6 is provided with an electromagnet 13 disposed coaxially with the plasma producing vessel 1. The direction of the magnetic lines of force of the electromagnet 13 is the same as the direction of advancement of a microwave. Electrons move for a magnetron motion under the combined force of a magnetic field formed by the electromagnet 13 and an electric field formed by the microwave. Therefore, the plasma producing vessel 1 is formed in a cavity resonator of a $TE_{11t}$ mode (t=a natural number). A second gas introducing pipe and the exhaust system are connected to the deposition vessel 2. Gases staying within the deposition vessel 2 are exhausted by the exhaust system.

The typical type 2 MW-PCVD apparatus shown in FIG. 6 converts a gas (hydrogen gas) through the first gas introducing pipe 6 into the plasma producing vessel 1 into a plasma by discharge caused by the microwave energy. When the magnetic flux density of the magnetic field is 875 gauss, the reflected wave of the microwave energy is almost zero. In this apparatus, the end plate 16 of the cavity resonator having the construction of a choke is moved under a vacuum according to the type of the gas, the pressure of the gas and the microwave power applied to the cavity resonator so that the cavity resonator meets required conditions. Electrons of the hydrogen plasma move for an electron cyclotron motion in the direction of the magnetic lines of force, and the radicals of the plasma react with the gas (silane gas) introduced through the second gas introducing pipe 5 into the deposition vessel 2 to form an a-Si film over the surface of a substrate 11.

Both the type 1 MW-PCVD apparatus and the type 2 MW-PCVD apparatus, however, have the following problems to be solved.

That is, the type 1 MW-PCVD apparatus has disadvantages: (i) the interior of the reactor must be maintained at a pressure of 1 torr or higher to maintain stable discharge: (ii) deactivation of the radicals during travel through the gas introducing pipe reduces film forming deposition rate: and (iii) a portion of the quartz tube at the junction of the quartz tube and the waveguide is caused to sputter by the concentrated intensity of the electric field and sputtered particles are mixed in the deposited film to deteriorate the electrical properties of the deposited film when the input microwave power is increased to increase the film forming rate.

Although there is no problem attributable to the deactivation of radicals and the sputtering of the quartz tube in the type 2 MW-PCVD apparatus, the type 2 MW-PCVD apparatus has the following problems.

That is, (iv) since film formation is performed under a pressure on the order of $10^{-4}$ torr, where the mean free path of the radicals is about 1 m, a-Si film is likely to be deposited on the microwave introducing window rather than on the substrate in forming an a-Si film by using hydrogen gas and silane gas and, consequently, an a-Si film is deposited gradually over the inner surface of the cavity resonator to make the maintenance of discharge and the start of discharge difficult, (v) the A-Si film deposited on the microwave introducing window falls off the microwave introducing window before long and falls on the substrate of the film formed on the substrate to deteriorate the quality of the deposited film, (vi) the interior of the deposition vessel needs frequent cleaning to obviate the deterioration of the deposited film by the film formed on fell off the microwave introducing window, and hence (vii) the rate of operation of the apparatus is low.

The type 2 MW-PCVD apparatus has a further problem adversely affecting the operating efficiency thereof that the end plate 16 of the cavity resonator must be moved under a vacuum to vary the length of the cavity resonator because the microwave introducing window 3 is fastened firmly to the waveguide 4.

SUMMARY OF THE INVENTION

Accordingly, it is a principal object of the present invention to provide an improved MW-PCVD apparatus eliminating the aforesaid problems in the conventional MW-PCVD apparatus.

It is another object of the present invention to provide an improved MW-PCVD apparatus capable of depositing a uniform and homogeneous film on a substrate having a comparatively large surface area by properly selecting a microwave propagation mode without using any large electromagnet, which is necessary for an apparatus of the ECR system.

It is a further object of the present invention to provide, an improved MW-PCVD apparatus capable of continuously matching the microwave impedance with discharge caused by microwave energy regardless of the sectional area of ionization of a gas and capable of mass-producing desired deposited films by effectively utilizing the microwave energy.

The present inventors have made extensive studies in order to eliminate the foregoing problems in the conventional MW-PCVD apparatus and to attain the foregoing objects of the present invention. As a result, it has been found that the problems in the conventional MW-PCVD apparatus can be eliminated and the foregoing objects of the invention can be attained by providing a MW-PCVD apparatus with (a) means for suppressing the reverse diffusion of a gas, employing pressure gradient instead of magnetic gradient which is employed by the MW-PCVD apparatus of the ECR system, (b) a film forming chamber constructed so as to function as a cavity resonator by matching a microwave without being dependent on plasma density, and (c) a bell jar within the cavity resonator for driving the microwave in a TM mode.

The present invention has been accomplished on the basis of the above findings and it provides a MW-PCVD apparatus essentially comprising a hermetic vacuum vessel, evacuating means for evacuating the vacuum vessel, and plasma producing means for producing a plasma in the vacuum vessel by introducing a microwave through a microwave transmission circuit into the vacuum vessel, characterized in that the microwave transmission circuit is provided with a cavity resonator formed integrally with two matching circuits.

The MW-PCVD apparatus thus constructed in accordance with the present invention solves all the problems in the conventional MW-PCVD apparatus, operates at a high rate of operation and at an improved operating efficiency to reduce the manufacturing cost of amorphous silicon devices and the like, and the elimination of the large electromagnet, which is necessary for the MW-PCVD apparatus of the ECR system, enables one to easily form a desired deposited film uniformly on the surface of a substrate having a large area by properly selecting a microwave propagation mode. Furthermore, the distance between the cavity resonator and a coupling hole is variable, the microwave impedance can continuously be matched regardless of the sectional area of ionization of the gas, which enables effective use of microwave power and highly efficient use of the gas.

DESCRIPTION OF THE PREFERRED EMBODIMENT

A constitution relating to the aforesaid article (a) can be incorporated into a MW-PCVD apparatus in accordance with the present invention in the following manner. A vacuum vessel is formed in the structure of a cavity resonator and the interior of a vacuum vessel comprises a section for a cavity resonator and a section for a film forming chamber which are divided by a perforated plate corresponding to the end plate of the foregoing cavity resonator. A gas, such as hydrogen gas or argon gas, other than a raw material gas, such as silane gas, is supplied into the cavity resonator of the vacuum vessel to maintain the pressure in the cavity resonator higher than the pressure in the film forming chamber so that the pressure within the vacuum vessel decreases at a pressure gradient from the cavity resonator toward the film forming chamber. Consequently, discharge occurs under a pressure in the range of $10^{-3}$ to 1 torr. Since the mean free path of radicals of a plasma produced under such a pressure is short and the flow of the gas is regulated by the pressure gradient, the reverse diffusion of the material gas is suppressed effectively.

A constitution relating to the aforesaid article (b) can be incorporated into the MW-PCVD apparatus in accordance with the present invention by providing two matching circuits capable of being adjusted according to the phase and amplitude of a microwave. Since the energy of a standing wave is accumulated between the matching circuits and the cavity resonator, it is desirable that the distance between the matching circuits and the cavity resonator is reduced to the least possible extent. Most desirably, the matching circuits and the cavity resonator are integrated and one of the matching circuit is used as a plunger for varying the cavity length.

Incidentally, the phase and amplitude of the reflected microwave are dependent primarily on plasma density and the morphology of a microwave feed circuit. That is, the plasma density and the complex refractive index $n - ik$ ($0 < n < 1$, $k$ is absorption coefficient) are dependent on the kind of the gas, gas pressure or an input microwave power. Accordingly, to maintain the function of the cavity resonator, the effects of $n$ and $k$ must be nullified.

Since it is difficult to nullify the effect of $n$ by varying the inside diameter of the cavity, the cavity length $L$ of the cavity resonator may be increased by a length equivalent to the reduction of the inside diameter of the cavity to $n$ times ($0 < n < 1$) the original length.

When the resonance frequency $f$ (2.45 GHz), the resonance mode $TM_{rst}$ and the inside diameter $nD$ of the cavity are known, the air equivalent value $L'$ of a new cavity length can be determined by expression:

$$(2L')^2 = t^2/\{(f/c)^2 - (y_{rs}/\pi nD)^2\} \quad (1)$$

where $y_{rs}$ is the root of the Bessel function: $Jr(y) = 0$, $c$ is the velocity of light.

As is obvious from the expression (1), the effect of $n$ can be nullified by varying the length $L$ of the cavity resonator according to the variation of $n$.

The effect of $k$, namely, the effects of the amplitude and phase lag $\delta$ of the reflected wave, can be nullified by adjusting the two matching circuits.

Practically, since $n$ and $k$ are dependent on each other, the length $L$ of the cavity resonator and the position of sliding matching irises may be adjusted for one set of $n$ and $k$.

On the other hand, the phase and amplitude of the reflected wave, which are dependent on the morphology of the microwave feed circuit, can be matched efficiently by the two matching circuits.

Figure 1:
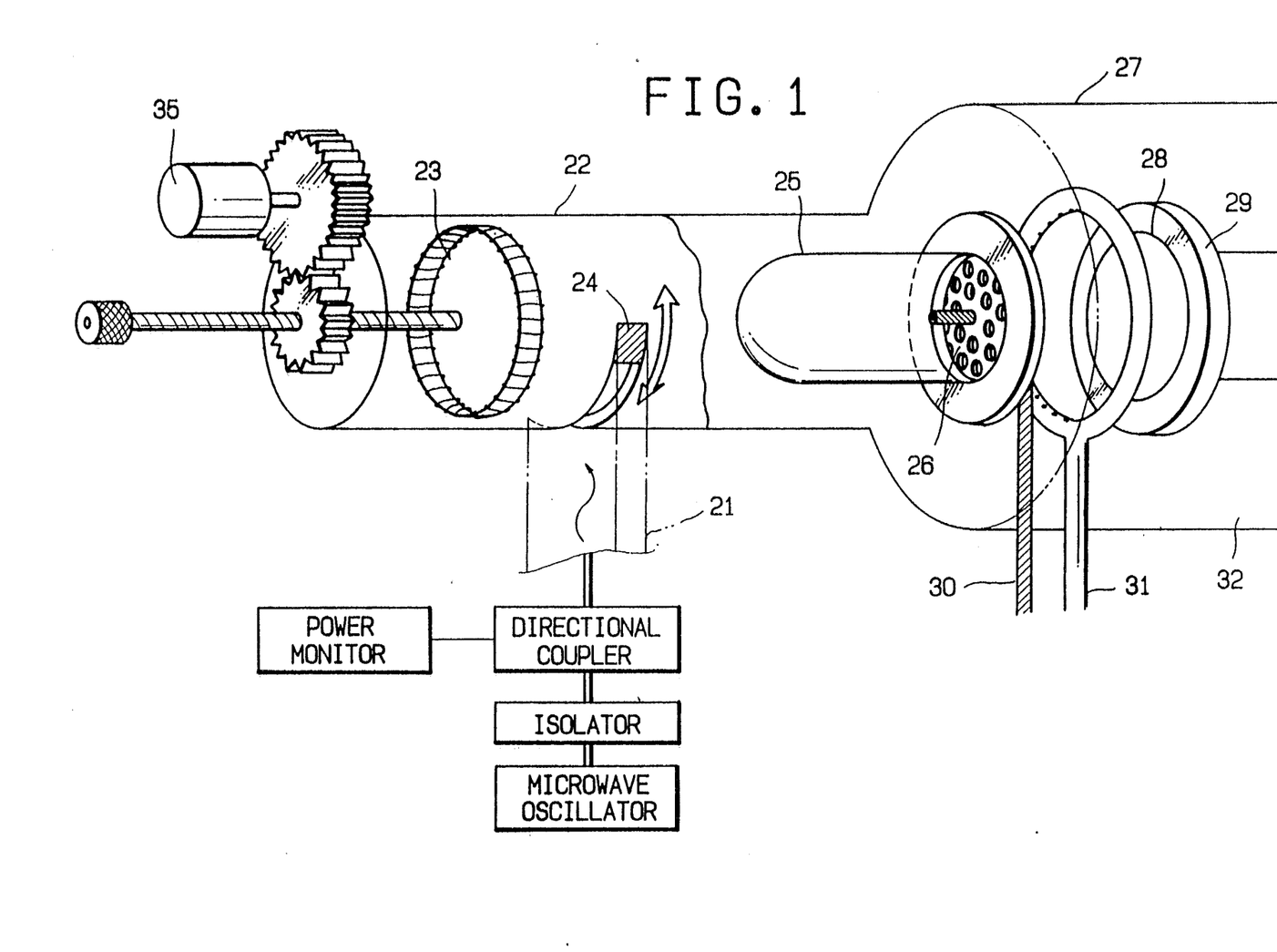
FIG. 1 is a schematic perspective view of a typical MW-PCVD apparatus embodying the present invention.

A constitution relating to the aforesaid article (c) can be incorporated into the MW-PCVD apparatus of the present invention by directly connecting a rectangular waveguide and a cylindrical cavity resonator with the axes thereof intersecting each other at right angles as shown in FIG. 1. When the rectangular waveguide and the cylindrical cavity resonator are thus connected, an operation for varying the length of the cavity resonator is not obstructed by the rectangular waveguide. In the cylindrical cavity resonator, the microwave is driven in $TM_{01n}$ ($n$ is a natural number), and the length of the cavity resonator can be changed even in the atmosphere facilitating the efficiency of operation.

The present invention will be described hereinafter with reference to the preferred embodiments thereof as shown in the accompanying drawings, however, the present embodiments are illustrative and not restrictive and hence the present invention is not limited thereto.

First Embodiment

A MW-PCVD apparatus in a first embodiment according to the present invention will be described with reference to FIG. 1 as incorporating a cylindrical cavity resonator.

Shown in FIG. 1 are a rectangular waveguide 21, a cylindrical cavity resonator 22, a plunger 23 for varying the length of the cavity resonator 22, a pair of cylindrical sliding matching irises 24, a microwave transmissive bell jar 25, a microwave reflector 26, a film forming vessel 27, a substrate 28, a substrate holder 29 and gas introducing pipes 30 and 31.

Essentially, the MW-PCVD apparatus shown in FIG. 1 is a MW-PCVD apparatus of a cavity resonator type comprising a microwave oscillator, now shown, a microwave transmission circuit, now shown, a cavity resonator, and a film forming vessel provided with a microwave transmissive bell jar defining a plasma producing chamber, gas introducing pipes (30 and 31) and a gas outlet (32).

Preferably, the cylindrical cavity resonator 22 is formed of a material having a low resistivity and high abrasion resistance in order that ohmic loss attributable to the surface current of a microwave and the cylindrical cavity resonator 22 will not be abraded by the plunger 23 which slides along the inner surface of the cylindrical cavity resonator 22. Accordingly, copper, brass, and a silver-plated, copper-plated or gold-plated stainless steel are desirable materials for forming the cavity resonator 22; and, above all, a silver-plated stainless steel is an optimum material.

The cylindrical cavity resonator 22 and rectangular waveguide 21 are joined together with the axes thereof intersecting each other at right angles to convert the $H_{10}$ ($TE_{10}$) mode of the rectangular waveguide 21 into the $E_{01}$ ($TM_{01}$) mode of a circular waveguide. The cavity resonator 22 is provided integrally with two matching circuits, namely, the plunger 23 for varying the length of the cavity resonator 22, and the cylindrical sliding matching irises 24.

The plunger 23 is movable along the axis of the cavity resonator 22. The plunger 23 may be driven for movement along the axis of the cavity resonator 22, for example, by a motor 35. To prevent abnormal discharge between the cavity resonator 22 and the plunger 23, the plunger 23 is formed of phosphor bronze for springs so that the plunger 23 is in stable contact with the cavity resonator 22.

The pair of cylindrical sliding matching irises 24 are disposed respectively at the opposite ends of the junction of the rectangular waveguide 21 and the cavity resonator 22. As indicated by a double-head arrow in FIG. 1, the pair of cylindrical sliding matching irises 24 are individually slidable along the cylindrical surface of the cavity resonator 22. Similarly to the plunger 23, the sliding matching irises 24 are formed of phosphor bronze in order that the sliding matching irises 24 are in stable contact with the cavity resonator 22.

The microwave transmissive bell jar 25 is disposed within the cavity resonator 22 of, for example, 120 mm in inside diameter. The bell jar 25 is connected to the film forming vessel 27. An O ring or a metallic sealing member for airtight seal and the microwave reflector 26 are provided between the flange of the bell jar 25 and the film forming vessel 27. A microwave is reflected by the microwave reflector 26, so that the gas is able to flow between the interior of the bell jar 25 and that of the film forming vessel 27.

The bell jar 25 is formed of quartz ($SiO_2$), alumina ($Al_2O_3$), boron nitride (BN) or silicon nitride (SiN).

The microwave reflector 26 is a perforated silver-, copper- or gold-plated metallic plate (a silver-plated metallic plate is particularly suitable) provided with a plurality of through holes, such as a perforated aluminum plate having a plurality of circular holes of 6 mm in diameter and a ratio of hole area of 60%, namely, a so-called punched board. The microwave reflector 26 is screwed to the film forming vessel 27 to suppress abnormal discharge. The microwave reflector 26 may be formed of an expanded metal.

Disposed within the film forming vessel 27 are the substrate 28, the substrate holder 29 and the two gas introducing pipes 30 and 31. The extremity of the gas introducing pipe 30 penetrates through the microwave reflector 26 and opens into the interior of the bell jar 25. The gas introducing pipe 31 has an annular extremity provided with a plurality of through holes for jetting a gas. The gas introducing pipe 31 is disposed between the bell jar 25 and the substrate holder 29.

The film forming vessel 27 is connected to a vacuum pump, not shown, for evacuating the film forming vessel 27.

Prior to the start of operation of the MW-PCVD apparatus thus constructed in accordance with the present invention, the length of the cavity resonator 22 is adjusted to a value slightly shorter than $m\lambda/2$ (m: a natural number). Concretely, the length of the cavity resonator 22 is decided so that the cavity resonator functions with the bell jar 25 disposed therein by measuring the network beforehand by a network analyzer (Hewlet Packard Co.). When the bell jar 25 is 3 mm in wall thickness, 70 mm in diameter and 100 mm in height, the decrement in the length of the cavity resonator 22 is 3 mm and the length of the cavity resonator 22 is 291 mm. When the bell jar 25 is 3 mm in wall thickness, 110 mm in diameter and 100 mm in height, the decrement in the length of the cavity resonator 22 is 4 mm and the length of the cavity resonator 22 is 290 mm.

After the length of the cavity resonator 22 has thus been adjusted, the operation of the MW-PCVD apparatus is started. In operation, an output microwave power of the microwave oscillator, not shown, is transmitted through the waveguide 21 and is amplified by the cavity resonator 22. Hydrogen gas or a gas mixture composed of hydrogen gas and argon gas introduced through the gas introducing pipe 30 into the bell jar 25 becomes excited to produce a plasma. However, since reflection of the microwave increases sharply after discharge has been started, the plunger 23 and the sliding matching irises 24 are adjusted so as to reduce reflected power monitored by a power monitor included in the microwave transmission circuit.

Table 1 shows the exemplary disposition of the two matching circuits to reduce the ratio of reflection of the microwave to a value less than 10% when the MW-PCVD apparatus employs a quartz bell jar of 3 mm in wall thickness, 70 mm in diameter and 100 mm in height to produce a hydrogen plasma. Values shown in Table 1 show the disposition of the two matching circuits after discharge has been started by setting the length of the cavity resonator 22 at 290 mm and fully opening the aperture between the sliding matching irises 24 (aperture: 96×27 mm) before starting discharge.

The microwave oscillator generates a microwave continuously. The microwave oscillator employed in the MW-PCVD apparatus is capable of generating a microwave having a percentage ripple not greater than 10% in the output power range of 200 to 500 W. Once the plasma is produced, a microwave power having a percentage ripple not greater than 10% is applied continuously to the plasma to establish a steady state. The length of the cavity resonator and the aperture between the sliding matching irises are adjusted once before discharge and once in the steady state after discharge so that the microwave impedance is matched.

In depositing an a-Si film or the like by the MW-PCVD apparatus of the present invention, the reverse diffusion of material gases in the system, which occurs in the conventional MW-PCVD apparatus, can simply be obviated by controlling the ratio between the flow rates of the material gases, so that a desired film can be deposited efficiently.

Film Forming Operation

An a-Si:H:F film was deposited on a quartz substrate by the foregoing MW-PCVD apparatus of the present invention. Film forming conditions are tabulated in Table 2.

In Table 2, $SiF_4$ gas is a material gas for forming a film, and $H_2$ gas and Ar gas are material gases for producing a plasma.

The reverse diffusion of the gases, which occurs in the conventional MW-PCVD apparatus, was obviated by regulating the flow rate ratio of the $SiF_4$ gas to the mixed gas of $H_2$ gas and Ar gas at 1/10 or above.

An A-Si:H:F film thus formed was evaluated by a conventional method of evaluation. The results of evaluation showed that the A-Si:H:F film had the following properties and was highly useful in practical application.

Photoconductivity $\sigma_p$: $3.5 \times 10^{-6}$ ($\Omega^{-1}cm^{-1}$)
Dark conductivity $\sigma_d$: $1.2 \times 10^{-10}$ ($\Omega^{-1}cm^{-1}$)
Optical band gap $E_{gopt}$: 1.86 (eV)
Activation energy: 0.73 (eV)

Second Embodiment

Figure 4:
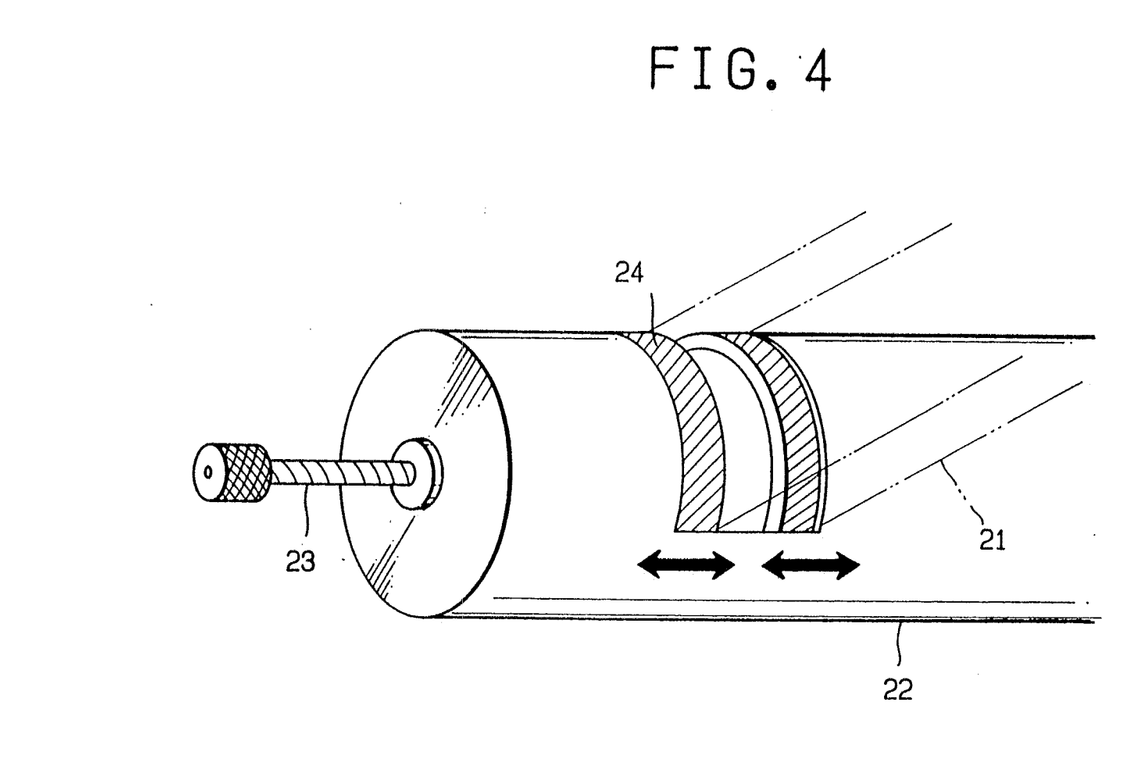

A MW-PCVD apparatus in a second embodiment according to the present invention will be described hereinafter. The MW-PCVD apparatus in the second embodiment employs cylindrical sliding matching irises 24 which slide in directions indicated by double-head arrows in FIG. 4 parallel to the axis of a cavity resonator 22 instead of the cylindrical sliding matching irises 24 employed in the first embodiment which turn about the axis of the cavity resonator 22. The sliding matching irises 24 are kept in stable sliding contact with the cavity resonator 22 by means similar to that employed in the first embodiment. The second embodiment is similar in construction to the first embodiment except in the following respects.

Where as the cylindrical aperture in the first embodiment is an inductive aperture (L aperture), the cylindrical aperture in the second embodiment is a capacitive aperture (C aperture). Therefore, the correction of microwave impedance of the second embodiment is greater than that of the first embodiment. Accordingly, the MW-PCVD apparatus in the second embodiment is suitable for a continuous film forming process using gasses greatly differing from each other in sectional area of ionization, such as a continuous film forming process using a gas having a small sectional area of ionization, such as hydrogen gas, for discharge in the initial stage of the film forming process, and using a gas having a large sectional area of ionization, such as argon gas or SiF$_4$ gas, for discharge for the further deposition of a film after exhausting the hydrogen gas.

When a rectangular cavity resonator is employed, flat sliding matching irises 24 are employed instead of the cylindrical sliding matching irises.

Third and Fourth Embodiments

Figure 2:
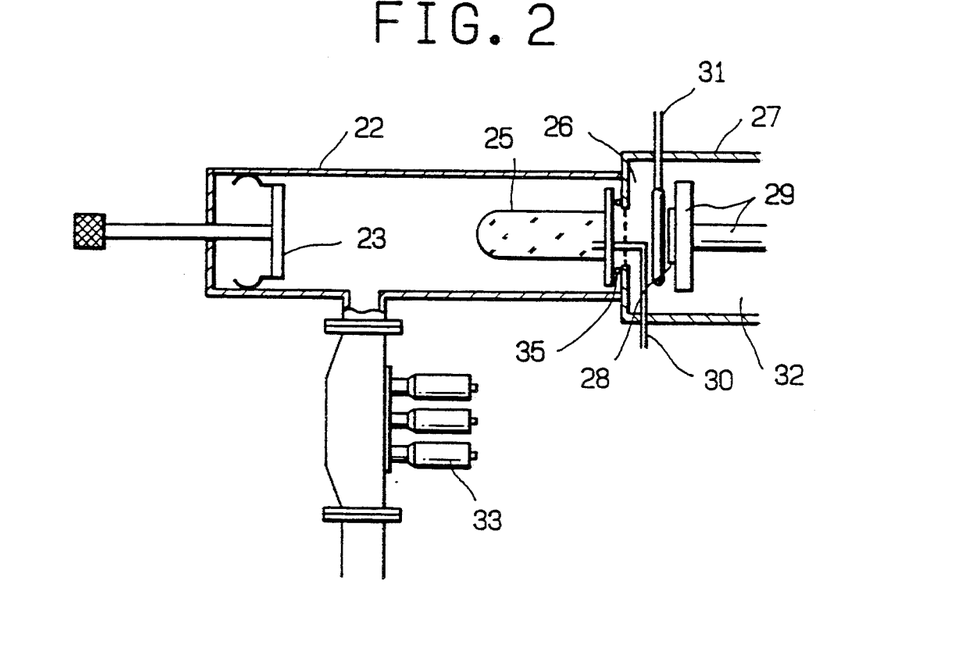
FIGS. 2, 3 and 4 are schematic sectional views respectively of MW-PCVD apparatus in further embodiments according to the present invention.
Figure 3:
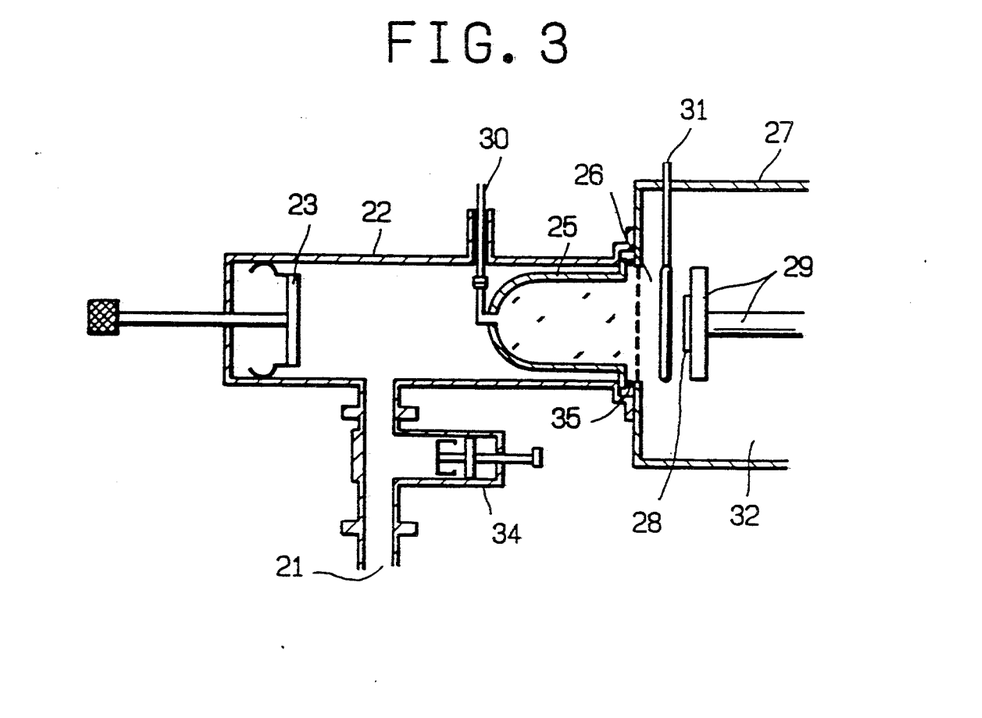

FIGS. 2 and 3 show MW-PCVD apparatus in third and fourth embodiments according to the present invention, respectively. The MW-PCVD apparatus in the third embodiment employs a three-stub tuner 33 instead of the sliding matching irises, and the MW-PCVD apparatus in the fourth embodiment employs an E-H tuner instead of the sliding matching irises.

In either of the third and fourth embodiments, microwave energy is liable to be accumulated between the cylindrical cavity resonator and the tuner and is lost in heat. Therefore, it is desirable to reduce the distance between the cylindrical resonator and the flange of the tuner to the least possible extent in order that the loss of microwave energy is prevented.

The MW-PCVD apparatus in the fourth embodiment has a gas introducing pipe 30 inserted through a sealing guide member of 6 mm in diameter and 70 mm in length attached to the side wall of a cavity resonator 22 in a bell jar 25 to introduce a gas into the bell jar 25. When input microwave power is excessively high, the inner surface of the gas introducing pipe 30 is caused to sputter by the plasma of the gas introduced into the bell jar 25. It is desirable to regulate in input microwave power at a value of 250 W or below to prevent the sputtering of the gas introducing pipe 30.

Fifth Embodiment

In matching the input microwave impedance in a reduced time in the first embodiment after discharge has been started, first the microwave impedance is matched roughly by the plunger 23 for varying the length of the cavity resonator 22, and then the input microwave impedance is matched precisely by the sliding matching irises 24. The ratio of the reflected power to the input power is calculated on the basis of a signal provided by the power monitor included in the microwave transmission circuit interposed between the microwave oscillator and the reaction chamber, and then the plunger 23 is driven for axial movement by the motor 35 (FIG. 1) to reduce the ratio to a minimum.

Upon the reduction of the ratio to a minimum, the plunger 23 is stopped, and then the cylindrical sliding matching irises 24 (first embodiment) or the tuner 33 (second embodiment) is operated for the fine matching of the microwave impedance to accomplish the matching operation.

TABLE 1

| Pressure | Microwave power (W) | | | |
|---|---|---|---|---|
| (torr) | 200 | 300 | 400 | 500 |
| 0.5 | 345/33 | 345/33 | 345/33 | 349/33 |
| 0.1 | 291/36 | 291/36 | 291/36 | 287/36 |
| 0.05 | 319/96 | 328/96 | 326/96 | 323/96 Full open |

TABLE 2

| Gasses | Flow rate (sccm) | Microwave power (W) | Pressure (torr) | Temperature of substrate (°C.) | Microwave reflector |
|---|---|---|---|---|---|
| SiF$_4$ | 20 | 250 | $2 \times 10^{-2}$ | 310 | $\phi$: 6 mm t: 0.8 mm ratio of hole area: 40% |
| H$_2$ | 150 | | | | |
| Ar | 200 | | | | |

What is claimed is:
1. A microwave plasma CVD apparatus comprising:
   (a) a hermetically sealed vacuum vessel;
   (b) raw material gas introducing means for introducing a raw material gas into the vacuum vessel;
   (c) evacuating means for evacuating said vacuum vessel; and
   (d) microwave introducing means for introducing microwaves through a microwave transmission circuit into said vacuum vessel to generate a plasma within the vacuum vessel; said microwave transmission circuit including a cavity resonator integrally provided with two matching circuits; said matching circuits comprising a plunger for varying the length of said cavity resonator and a pair of sliding matching irises.
2. The microwave plasma CVD apparatus according to claim 1 wherein said cavity resonator is a cylindrical cavity resonator and said sliding matching irises are cylindrical sliding matching irises.
3. The microwave plasma CVD apparatus according to claim 1, wherein said cavity resonator is a rectangular cavity resonator and said sliding matching irises are flat sliding matching irises.
4. The microwave plasma CVD apparatus according to claim 1, wherein the microwave introducing means comprises a continuously oscillating microwave oscillator and wherein a microwave transmissive bell jar defining a space for discharge is provided within the cavity resonator.
5. The microwave plasma CVD apparatus according to claim 1, wherein said microwave transmission circuit includes power monitor means and a feedback control means to sequentially (i) calculate the ratio of the reflected power to the input power on the basis of a signal provided by the power monitor means, (ii) drive one of the matching circuits for rough matching of the microwave input impedance, and (iii) drive the other matching circuit for fine matching of the microwave impedance so that the calculated ratio is reduced to a minimum.
6. Method for controlling feedback in the apparatus of claim 5 comprising the steps of:
   (a) calculating the ratio of the reflected power to the input power on the basis of a signal provided by the power monitor means;
   (b) driving one of the matching circuits for rough matching of the microwave impedance; and
   (c) driving the other matching circuit for fine matching of the microwave impedance so that the calculated ratio is reduced to a minimum.

* * * * *

UNITED STATES PATENT AND TRADEMARK OFFICE
CERTIFICATE OF CORRECTION

PATENT NO. : 5,069,928

DATED : December 3, 1991

INVENTOR(S) : HIROSHI ECHIZEN, ET AL.

It is certified that error appears in the above-indentified patent and that said Letters Patent is hereby corrected as shown below:

COLUMN 2

Line 19, "first," should read --first--.

COLUMN 3

Line 35, "A-Si" should read --a-Si--.
Line 65, "vide," should read --vide--.

COLUMN 5

Line 24, "circuit" should read --circuits--.

COLUMN 6

Line 27, "now" should read --not--.
Line 28, "now" should read --not--.

COLUMN 7

Line 47, "(Hewlet Packard Co.)." should read --(Hewlett Packard Co.).--.

UNITED STATES PATENT AND TRADEMARK OFFICE
CERTIFICATE OF CORRECTION

PATENT NO. : 5,069,928
DATED : December 3, 1991
INVENTOR(S) : HIROSHI ECHIZEN, ET AL.

It is certified that error appears in the above-indentified patent and that said Letters Patent is hereby corrected as shown below:

COLUMN 8

Line 44, "A-Si:H:F" should read --a-Si:H:F--.
Line 46, "A-Si:H:F" should read --a-Si:H:F--.

COLUMN 9

Line 1, "Where as" should read --Whereas--.
Line 49, "in" should read --an--.

COLUMN 10

Line 55, "input" should be deleted.

Signed and Sealed this

Twenty-seventh Day of September, 1994

Attest:

BRUCE LEHMAN

Attesting Officer     Commissioner of Patents and Trademarks